United States Patent [19]

Ohsawa

[11] Patent Number: 4,669,065
[45] Date of Patent: May 26, 1987

[54] DYNAMIC MEMORY APPARATUS HAVING A SENSE AMPLIFIER AND A REFERENCE VOLTAGE CONNECTION CIRCUIT THEREFOR

[75] Inventor: Akira Ohsawa, Kyoto, Japan
[73] Assignee: Matsushita Electronics Corporation, Osaka, Japan
[21] Appl. No.: 671,425
[22] Filed: Nov. 14, 1984
[30] Foreign Application Priority Data
  Nov. 26, 1983 [JP] Japan .................. 58-222956
[51] Int. Cl.⁴ ............................................. G11C 11/24
[52] U.S. Cl. ....................................... 365/210; 365/149
[58] Field of Search ............... 365/149, 205, 207, 208, 365/209, 210, 190

[56] References Cited
U.S. PATENT DOCUMENTS
  4,099,265  7/1978  Abe ..................................... 365/190
  4,578,780  3/1986  Baba .................................... 365/149
  4,581,719  4/1986  Penchuk .............................. 365/203

Primary Examiner—James W. Moffitt
Attorney, Agent, or Firm—Spencer & Frank

[57] ABSTRACT

A memory apparatus has a dummy cell comprising two sets of series connections of MOS transistors and capacitors, respectively, connected to a pair of bit lines, which are connected to a sense amplifier of a flip-flop type, and a third MOS transistor having a source and a drain thereof connected between junction points of the MOS transistors and the capacitors of the dummy cell. The capacitors are charged at a high level potential and a low level potential, respectively, of the bit lines and then they are shorted to each other through the third MOS transistor so that they have a common potential of a middle potential level. The potential of the middle level can be supplied to a pair of input terminals to the flip-flop type sense amplifier as a reference potential signal. Thus, it is possible to assure a stable sensing operation by the sense amplifier which is free from an influence of a change in the potential of a substrate of the memory apparatus.

8 Claims, 6 Drawing Figures

DYNAMIC MEMORY APPARATUS HAVING A SENSE AMPLIFIER AND A REFERENCE VOLTAGE CONNECTION CIRCUIT THEREFOR

BACKGROUND OF THE INVENTION

1. Field of the Invention

The present invention relates to a memory apparatus, and more particularly to a dummy cell for supplying a reference voltage to a sense amplifier of a MOS type dynamic memory.

2. Description of the Prior Art

A MOS type dynamic memory usually uses memory cells each thereof comprising a set of a MOS capacitor and a MOS transistor for controlling a charge stored in the MOS capacitor. A number of such memory cells are connected in parallel with a pair of input lines (bit lines) of a flipflop type sense amplifier. A reference voltage is generated by a dummy cell to be supplied to either one of the two bit lines to detect the presence or absence of an electric charge in each of the memory cells.

SUMMARY OF THE INVENTION

It is an object of the present invention to provide a construction of the memory apparatus having a dummy cell which is not affected by a change in a substrate potential, produces a reference voltage for the bit line which has a middle value between the values thereof at the time when the memory cell has "1" and "0" levels, respectively, and maintains a state of complete balance between static capacitances of the two bit lines.

The memory of the present invention has a construction in which a dummy cell comprising a series connection of a MOS transistor and a capacitor is coupled to each of two bit lines connected to a sense amplifier, respectively, and a source and a drain of a third MOS transistor are connected between the connection points of the MOS transistors and capacitors, respectively, whereby the capacitors of the pair of dummy cells having the "0" level and the "1" level, respectively, are shorted by being connected in parallel with each other so that a reference voltage having an intermediate value between the voltages of both capacitors is generated to be supplied to either one of the two bit lines, thereby preventing an influence of a change in the substrate potential.

DESCRIPTION OF THE PREFERRED EMBODIMENTS

Figure 1:
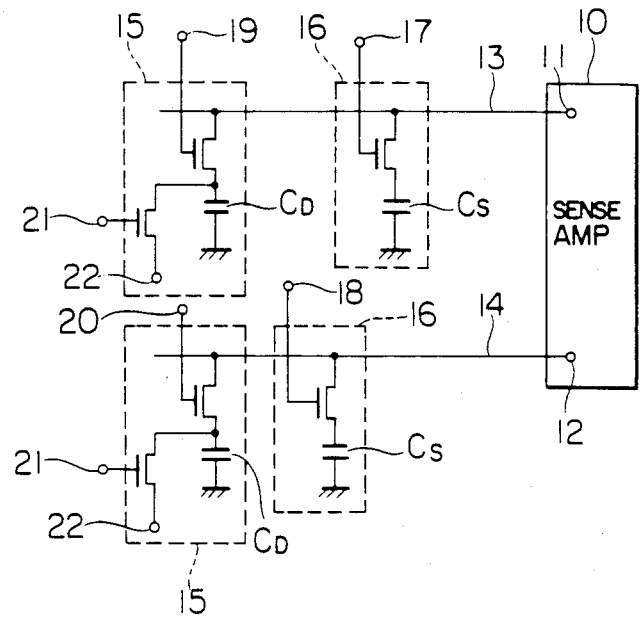
FIG. 1 is a schematic circuit diagram of a conventional memory apparatus.

FIG. 1 is a schematic circuit diagram illustrating a sense system of a conventional MOS type dynamic memory. Bit lines 13 and 14 are connected to respective input terminals 11 and 12 of a flip-flop type sense amplifier 10. Connected to the respective bit lines 13 and 14 are a dummy cell 15 and a number of (for example, 64 in a 64K-bit RAM) memory cells 16. Each of the memory cells 16 comprises a series connection of a capacitor and a MOS transistor, and word lines 17 and 18 are taken out from the respective memory cells 16. The dummy cell 15 comprises a capacitor and two MOS transistors, and dummy word lines 19 and 20 are taken out from the respective dummy cells 15. Each dummy cell has a dummy cell write signal input line 21 and a dummy cell write data input line 22.

Figure 2:
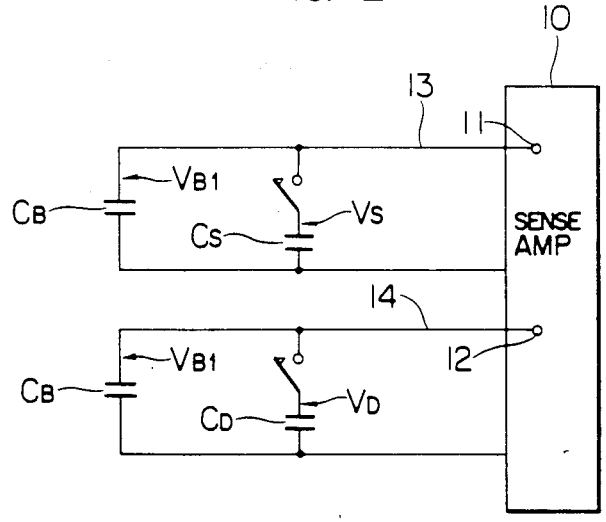
FIG. 2 is a schematic equivalent circuit diagram of the circuit shown in FIG. 1.

FIG. 2 is a schematic equivalent circuit diagram of a selected one of the memory cells connected to the bit lines 13 and 14. The static capacitance of each of the bit lines 13 and 14 is represented by $C_B$, the static capacitance of the capacitor of the memory cell 16 is represented by $C_S$, the static capacitance of the capacitor of the dummy cells 15 is represented by $C_D$, the precharge potential of each of the bit lines 13 and 14 before the word line 17 and the dummy word line 20 assume a high level is represented by $V_{B1}$, the potential of the capacitor $C_S$ of the memory cell 16 in the above same state is represented by $V_S$, and the potential of the capacitor $C_D$ of the dummy cell 15 in the above same state is represented by $V_D$. Under the conditions, the word line 17 and the dummy word line 20 are at a sufficiently high level (higher than the sum of the precharge potential $V_{B1}$ of the bit lines 13 and 14 and the threshold potential of the MOS transistor comprised in the memory cell 16 and the dummy cell 15, respectively). Then, the potentials $V_{B2}$ of the respective bit lines 13 and 14 at the time when the potential of the memory cell capacitor $C_S$ and that of the bit line 13 become equal to each other and the potential of the dummy cell capacitor $C_D$ and that of the bit line 14 become equal to each other are represented as follows.

$$\text{Potential } V_{B2} \text{ of bit line } 13 = \frac{V_S \cdot C_S + V_{B1} \cdot C_B}{C_S + C_B} \quad (1)$$

$$\text{Potential } V_{B2} \text{ of bit line } 14 = \frac{V_D \cdot C_D + V_{B1} \cdot C_B}{C_D + C_B} \quad (2)$$

The potentials $V_{B2}$ of the respective bit lines 13 and 14 are compared by a sense amplifier 10 to determine whether a signal written into the memory cell 16 has "1" level or "0" level.

The dummy cell 15 may be constructed in one of the following two types. In a first type of construction of the dummy cell 15, the capacitance $C_D$ of the capacitor of the dummy cell 15 is one half the capacitance $C_S$ of the capacitor of the memory cell 16 and the "0" level potential of the sense amplifier 10 is written from the data input line 22. In a second type of construction of the dummy cell 15, the capacitor of the dummy cell 15 has the same magnitude of capacitance as that of the memory cell 16 and a potential intermediate between the "1" level and "0" level of the sense amplifier 10 is written from the data input line 22.

When the dummy cell has the construction of the first type, in an exemplifying case of 64 K-bit RAM, the capacitance values of the capacitors are usually $C_B = 500$ fF, $C_S = 50$ fF and $C_D = 25$ fF, and the operating voltages are $V_{B1} = 5$ volts, $V_S = 5$ volts ("1" level of the memory cell) and $V_S = 0$ volt ("0" level of the memory cell).

Calculating the value of $V_{B2}$ from the equations (1) and (2) on the basis of the above-mentioned values, we obtain Potential $V_{B2}$ ($V_S = 5$ V) of bit line 13 = $\dfrac{5 \times 50 + 5 \times 500}{50 + 500} = 5$ V Potential $V_{B2}$ ($V_S = 0$ V) of bit line 13 = $\dfrac{5 \times 500}{50 + 500} \approx 4.545$ V Potential $V_{B2}$ ($V_D = 0$ V) of bit line 14 = $\dfrac{5 \times 500}{25 + 500} \approx 4.762$ V Thus, when the memory cell 16 is at the "1" level, the potential of the bit lien 13 becomes higher by 0.238 V than the potential of the bit line 14 to which the dummy cell 15 is connected, and when the memory cell 16 is at the "0" level, the former becomes lower by 0.217 V than the latter. The sense amplifier 10 senses these potential differences. Thus, the dummy cell 15 serves to supply the sense amplifier 10 with a reference voltage having a substantially middle value between the potential levels of the bit line 13 at the time when the memory cell 16 is at the "1" level and the "0" level, respectively. As shown above, the potential difference between the bit line 13 and the bit line 14 when the memory cell 16 has the "0" level is slightly smaller than that when the memory cell 16 has the "1" level. If it is required to make the potential differences completely equal to each other, it is necessary to make the static capacitance $C_D$ of the capacitor of the dummy cell 15 to be slightly smaller than one half of the static capacitance $C_S$ of the capacitor of the memory cell 16.

The capacitor of the memory cell 16 is usually constituted by a MOS capacitor having a conductive layer formed on a semiconductor substrate with an insulating layer interposed therebetween. As shown in the equivalent circuit of FIG. 3, the static capacitance $C_S$ of the capacitor of the memory cell 16 comprises a parallel connection of a capacitance $C_{SG}$ formed on a zero volt point (ground) and a capacitance $C_{SB}$ formed on a semiconductor substrate. The potentials at the operating points (e.g. the bit lines 13 and 14 in FIG. 1) in the circuit of the MOS dynamic memory change in synchronism with a control clock signal. A timing chart therefor is shown in FIG. 4. As seen from FIG. 4, when the control clock signal 41 changes to the low level, the dummy cell write signal 42 applied to the terminal 21 changes to the low level at a time $t_{11}$ (The dummy cell writing is effected when the level of the dummy cell write signal 42 is high, while, the dummy cell reading is effected while the level of the dummy word line signal is high). Then, the word line and dummy word line signal 43 applied respectively to the terminals 17 and 20 change to the high level at a time $t_{12}$, and the potentials of the memory cell 16 and the dummy cell 15 appear on the bit lines 13 and 14, respectively. The sense amplifier 10 compares the potentials 44 of the bit lines 13 and 14 with each other at a time $t_{15}$ and the reading of the memory is effected. (FIG. 4 shows, as an example, a case where the potential of the bit line 13 connected to the memory cell 16 is at the higher level.) When the memory is read out by the sense amplifier 10, the high level signal is amplified and fed back to the bit line 13, so that the amplified high level signal is written into the memory cell 16 connected to the bit line 13.

Next, when the control clock signal 41 changes to the high level, the word line and dummy word line signals 43 change respectively to the low level at a time $t_{14}$ so that the respective connections of the memory cell 16 and the dummy cell 15 with the bit lines 13 and 14 are disconnected, and the write operation to the memory cell ends. Subsequently, the dummy cell write signal 42 returns to the high level and the writing to the dummy cell is effected. In a next cycle, when the control clock signal 41 changes again to the low level, the respective signals repeat the same changes as those occurred at the time $t_{11}$ to $t_{14}$ in the previous cycle, sequentially at times $t_{21}$ to $t_{24}$. Since the operating points in the circuit operating in synchronism with the control clock signal 41 have inherently static capacitances formed between the operating points and the substrate through the depletion layer or insulation layer intervening therebetween, the potential $V_{SUB}$ of the substrate changes in synchronism with a change in the potentials of the operating points in the circuit. Since it is usual that the static capacitance between the bit lines and the substrate is largest, the substrate potential 45 changes with a change in the bit line potential 44, as shown in FIG. 4.

Figure 3:
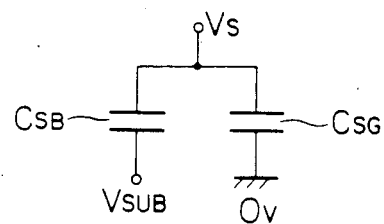
FIG. 3 is an equivalent circuit diagram of a memory cell capacitor in the conventional memory apparatus.
Figure 4:
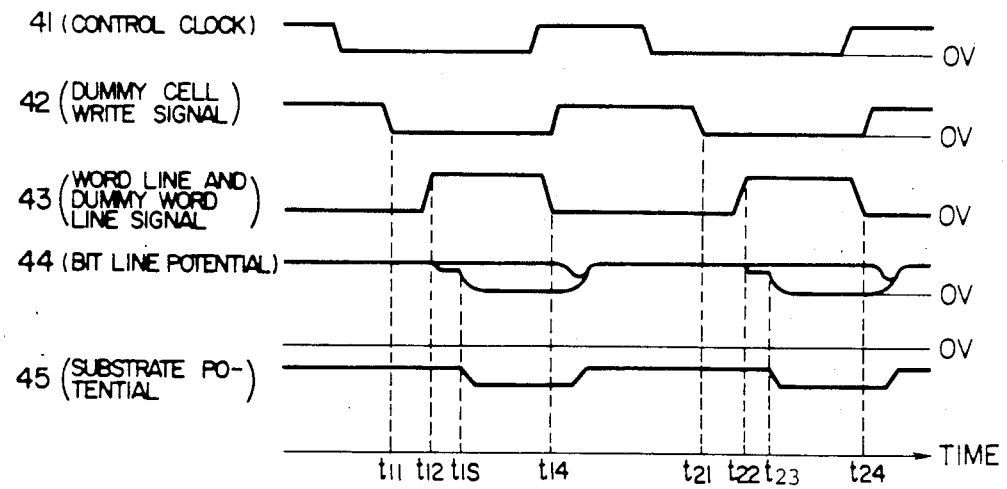
FIG. 4 is a timing chart for the operation by the conventional memory apparatus shown in FIG. 1.

Let us consider in detail a relation between the memory cell capacitor potential $V_s$ and the substrate potential $V_{SUB}$ shown in the equivalent circuit in FIG. 3. As explained with reference to FIG. 4, the writing to the memory cell 16 is completed at the time $t_{14}$ and the reading in the next cycle is performed at the time $t_{22}$ (see the word line signal 43 in FIG. 4). Here, the substrate potential 45 is at the low level at the time $t_{14}$ and at the high level at the time $t_{22}$. Thus, since the level of the substrate potential $V_{SUB}$ at the writing completion time and that at the reading time differ from each other, the memory cell potential $V_S$ varies with a variation in the substrate potential $V_{SUB}$. The variation quantity $\Delta V_S$ of the memory cell potential $V_S$ is represented by the following equation:

$$\Delta V_S = V_{S2} - V_{S1} = \frac{C_{SB}(V_{SUB2} - V_{SUB1})}{C_{SB} + C_{SG}} \quad (3)$$

Where $V_{S1}$ is the memory cell potential at the writing completion time, $V_{SUB1}$ is the substrate potential at the writing completion time, $V_{S2}$ is the memory cell potential immediately before the reading time, and $V_{SUB2}$ is the substrate potential immediately before the reading time.

With respect to an practical examply, assuming that $C_{SB} = 10$ fF ($1$ fF $= 10^{-15}$ F), $C_{SG} = 40$ fF, $V_{SUB2} = -3$ V and $V_{SUB1} = -5$ V, the variation quantity $\Delta V_S$ of the memory cell potential $V_S$ becomes 0.4 V. Thus, though the memory cell potential $V_S$ had the high level of 5 V and the low level of zero V at the time of writing, the memory cell potential $V_S$ is changed to have the high level of 5.4 V and the low level of 0.4 V immediately before the reading operation due to the addition of the variation quantity of the substrate potential $V_{SUB}$ thereto. On the other hand, with respect to the dummy cell potential $V_D$, there occurs no change in the substrate potential 45 between the dummy cell writing completion time $t_{21}$ and the time $t_{23}$ when the dummy cell reading has been completed sufficiently, and hence the dummy cell potential $V_D$ does not change.

Here, the bit line potential is recalculated from the above equations (1) and (2) as follows, taking the change of the substrate potential into consideration.

Potential $V_{B2}$ ($V_S$ = 5.4 V) of bit line 13 =

$$\frac{5.4 \times 50 \times 5 \times 500}{50 + 500} \approx 5.036 \ V$$

Potential $V_{B2}$ ($V_S$ = 0.4 V) of bit line 13 =

$$\frac{0.4 \times 50 + 5 \times 500}{50 + 550} \approx 4.582 \ V$$

Potential $V_{B2}$ ($V_D$ = 0 V) of bit line 14 =

$$\frac{5 \times 500}{25 + 500} \approx 4.762 \ V$$

Thus, the potential of the bit line 13 is higher by 0.274 V than the potential of the bit line 14 when the memory cell level is "1", and the former is lower by 0.180 V than the latter when the memory cell level is "0". As described before when the substrate potential does not change, the potential of the bit line 13 was higher than the potential of the bit line 14 by 0.238 V, and the former was lower than the latter by 0.217 V. Thus, it is seen that the change of the substrate potential tends to reduce the difference between the potential of the bit line 13 when the memory cell potential $V_S$ is at the low level and the reference potential thereby to decrease a margin for the sensing operation. In order to set the reference potential to an exact middle value, it is necessary to further reduce the static capacitance of the capacitor of the dummy cell. However, since the variation quantity of the respective static capacitances $C_S$ and $C_D$ of the memory cell capacitor and the dummy cell capacitor, the substrate potential, etc. change with manufacturing variations, it is difficult to precisely compensate for such variation quantity.

Another problem is that the static capacitance of the dummy cell capacitor $C_D$ is approximately one half that of the memory cell capacitor $C_S$. When viewed from the sense amplifier 10, the static capacitance of the bit line 13 immediately before the operation of the sense amplifier is initiated (namely, when the memory cell is selected) is $C_B + C_S = 550 \ fF$ and the static capacitance of the bit line 14 (when the dummy cell is selected) is $C_B + C_D = 525 \ fF$, as seen from FIG. 2. Accordingly, the static capacitance of the bit line 13 is larger than that of the bit line 14. The sensitivity of the sense amplifier 10 becomes maximum when the respective static capacitances of the bit lines 13 and 14 are equal to each other. Therefore, the unbalance between the respective static capacitances of the bit lines 13 and 14 causes a reduction in the sensitivity of the sense amplifier.

In the previously-mentioned second type of construction of the dummy cell 15 in which the dummy cell capacitor has the same magnitude of capacitance as the memory cell capacitor, the unbalance in the static capacitance between the bit lines 13 and 14 gives rise to no problem. However, the influence of the variation in the substrate potential remains in the same way as the first type of construction of the dummy cell 15. Further, though a potential of a middle level is to be written in the dummy cell 15 in this case, it is difficult to adjust the potential of the data input line 22 in FIG. 1 exactly to one-half the power supply voltage. Accordingly, it is inevitable that the reference voltage deviates from the middle value also in this case.

In addition, the circuit in FIG. 1 requires the extra dummy cell write signal input line 21 and dummy cell write data input line 22, which has a disadvantage of making the circuit construction more complicated.

DESCRIPTION OF THE PREFERRED EMBODIMENTS

Figure 5:
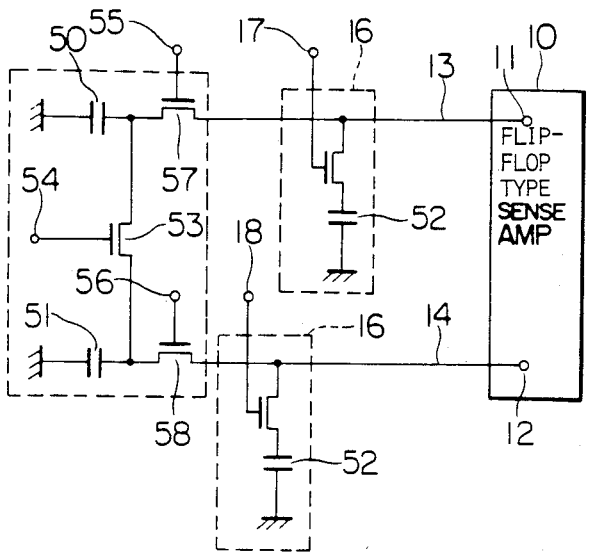
FIG. 5 is a schematic circuit diagram of the memory apparatus of an embodiment of the present invention.

FIG. 5 is a schematic circuit diagram of the memory apparatus of an embodiment of the present invention.

In FIG. 5, capacitors 50 and 51 having the same magnitude of static capacitance as that of a capacitor 52 of each memory cell 16 are provided in a dummy cell section, and the capacitors 50 and 51 are coupled to each other through a MOS transistor 53. The MOS transistor 53 conducts when its gate input terminal 54 is supplied with a high level and couples the capacitors 50 and 51 to each other. In the present embodiment, the writing into the dummy cell is effected by a sense amplifier 10, so that no dummy cell write signal input line nor dummy cell write data input line, as shown in FIG. 1, is required, and, as a result, it is possible to simplify the circuit construction.

Figure 6:
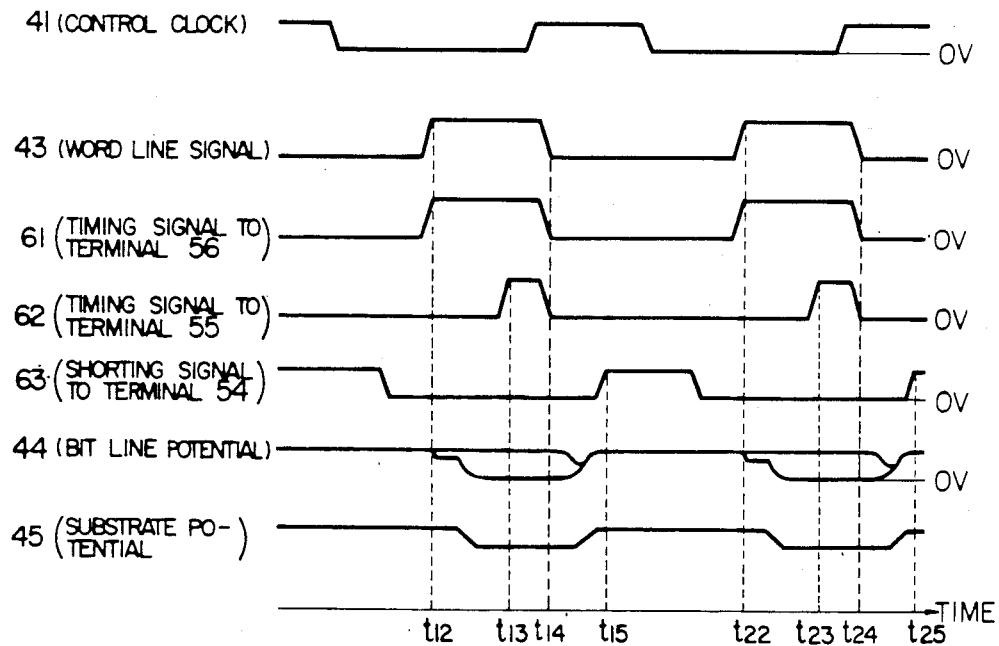
FIG. 6 is a timing chart for the operation by the memory apparatus of the present invention shown in FIG. 5.

FIG. 6 is a timing chart for the operation by the memory apparatus of the present embodiment shown in FIG. 5. A word line signal 43 is applied to a terminal 17, and a timing signal 61 is applied to a gate input terminal 56 of a MOS transistor 58. A timing signal 62 is applied to a gate input terminal 55 of a MOS transistor 57, and a shorting signal 63 is applied to the gate input terminal 54 of the MOS transistor 53.

Let us assume that an "H" signal has been written into the memory cell 16 connected to the bit line 13.

Firstly, at a time $t_{12}$, the word line signal 43 is applied to the terminal 17 and the timing signal 61 is applied to the gate input terminal 56 of the MOS transistor 58. Accordingly, the "H" signal is supplied to the bit line 13 and a reference potential signal of the dummy cell capacitor 51 supplied to the bit line 14. Then, the sense amplifier 10 senses the "H" signal on the bit line 13, amplifies it and supplies the amplified "H" signal to the bit line 13, and, on the other hand, it supplies the "L" signal to the bit line 14. Thus, the amplifier "H" signal is rewritten into the memory cell 16 connected to the bit line 13, and now the "L" signal is written into the dummy cell capacitor 51 connected to the bit line 14.

At a time $t_{13}$, the timing signal 62 is applied to the gate input terminal 55 of the MOS transister 57, so that the "H" signal is written into the dummy cell capacitor 50 connected to the bit line 13.

Thus, at a time $t_{14}$, the writing of the "H" and "L" signals into the dummy cell capacitors 50 and 51 is completed, respectively.

At a time $t_{15}$, the shorting signal 63 is applied to the gate input terminal 54 of the MOS transistor 53, so that the potentials of the respective dummy cell capacitors 50 and 51 change to a middle value between the "H" level and "L" level to establish the reference potential signal.

At a time $t_{22}$, the word line signal 43 is applied to the terminal 17 and the timing signal 61 is applied to the gate input terminal 56 of the MOS transistor 58. Accordingly, the "H" signal from the memory cell 16 is applied to the bit line 13, and the reference potential signal from the dummy cell capacitor 51 is supplied to the bit line 14. The potentials on the respective bit lines 13 and 14 are compared by the sense amplifier 10. When the sense amplifier 10 senses the "H" potential of the signal on the bit line 13, it amplifies the "H" signal and supplies the amplified "H" signal to the bit line 13, and on the other hand, it supplies the "L" signal to the bit line 14. Thus, the "L" signal is written into the dummy cell capacitor 51 and the "H" signal is written into the memory cell 16 connected to the bit line 13.

At a time $t_{23}$, the timing signal 62 is applied to the gate input terminal 55 of the MOS transistor 57, so that the "H" signal is written into the dummy cell capacitor 50. Thus, at a time $t_{24}$, the write operation is completed. At a time $t_{25}$, the shorting signal 63 is applied to the gate input terminal 54 of the MOS transistor 53 so that a new reference potential signal is established in the dummy cell capacitors 50 and 51, respectively, as described above.

In this way, the operations of reading from the memory cell 16 and writing into the dummy cell section are effected.

A practical example of this case is described hereunder.

As an example, when the reference potential changes by $-2$ V, the potentials of the dummy cell capacitors 51 and 50, which were at the low level of 0 V and the high level of 5 V, respectively, at the write time (at the time $t_{14}$), rise to the low level of 0.4 V and the high level of 5.4 V, respectively, in accordance with the equation (3) because the substrate potential changes at the timing of application of the shorting signal 63. However, both of the low and high levels become 2.9 V immediately before the read operation. Accordingly, from the equation (2), the potential of the bit line 14 is represented as follows:

Potential $V_{B2}$ ($V_D = 2.9$ V) of bit line 14 =

$$\frac{2.9 \times 50 + 5 \times 500}{50 + 500} \approx 4.809 \ V$$

When the memory cell is at the high level, the potential $V_{B2}$ ($V_S = 5.4$ V) of the bit line 13 becomes 5.036 V by the same calculation as that of the prior art example, and when the memory cell is at the low level, the potential $V_{B2}$ ($V_S = 0.4$ V) of the bit line 13 becomes 4.582 V. Therefore, the potential differences between the potential of the bit line 13 and that of the bit line 14 are 5.036 V $-4.809$ V $= 0.227$ V and 4.582 V $-4.809$ V $= -0.227$ V, respectively. Thus, the potential of the bit line 14 assumes a precisely middle value. In other words, in the present embodiment, since the change in the substrate potential exerts an exactly identical influence on both of the memory cell and the dummy cell, so that there appears no difference between the potentials of both bit lines 13 and 14 at the time of the read operation.

Further, FIG. 5 shows a construction such that one of the two electrodes of the dummy cell capacitors 50 and 51 and the memory cell capacitor 52 are grounded (or connected to a zero V point in the circuit). However, they may be connected commonly to a point of the other potential.

In accordance with the featured construction of the memory apparatus of the present invention, the dummy cell capacitors, in which the high level and low level potentials have been written, respectively, are shorted to each other through a MOS transistor, so that it is made possible to prevent any adverse influence of a change in the substrate potential and to obtain a reference potential of a precisely middle value without requiring an adjustment of the capacitances of the dummy cell capacitors and then to supply it to the flip-flop type sense amplifier as a reference potential thereof. Thus, the present invention has a great practical meritorious effect to realize a stable sensing operation by a MOS type semiconductor memory.

I claim:

1. A dynamic memory apparatus comprising:
   a sense amplifier;
   a pair of bit lines connected to said sense amplifier;
   a plurality of memory cells each comprising a series connection of a first MOS transistor and a first capacitor and each connected to a respective one of said bit lines;
   a pair of dummy cells each comprising a series connection of a second MOS transistor and a second capacitor, each dummy cell being connected to a respective one of said bit lines; and
   a third MOS transistor having a source and a drain, said source being connected to the junction point between said second MOS transistor and said second capacitor of one of said dummy cells, and said drain being connected to the junction point between said second MOS transistor and said second capacitor of the other one of said dummy cells.

2. A dynamic memory apparatus according to claim 1, wherein said sense amplifier is a flip-flop type sense amplifier and has a pair of inputs each connected to a respective one of said bit lines.

3. A dynamic memory apparatus according to claim 1 wherein each said second MOS transistor comprises a gate input terminal connected for receiving an individually supplied control signal.

4. A dynamic memory apparatus according to claim 1 wherein the capacitance of each said second capacitor is substantially equal to that of each said first capacitor.

5. A dynamic memory apparatus according to claim 4, wherein said sense amplifier is a flip-flop type sense amplifier and has a pair of inputs each connected to a respective one of said bit lines.

6. A dynamic memory apparatus comprising:
   a sense amplifier;
   a pair of bit lines connected to said sense amplifier;
   a plurality of memory cells each comprising a series connection of a first MOS transistor and a first capacitor and each connected to a respective one of said bit lines;
   a pair of dummy cells each comprising a second MOS transistor and a second capacitor connected together in series at a junction point, each dummy cell being connected to a respective one of said bit lines; and
   switching means connected for forming a short circuit connection between the junction points of said pair of dummy cells immediately before performing a read operation of said memory cells to make respective potentials of said second capacitors equal to each other.

7. A dynamic memory apparatus according to claim 6, wherein said sense amplifier in a flip-flop type sense amplifier and has a pair of inputs each connected to a respective one of said bit lines.

8. A dynamic memory apparatus comprising:
   a sense amplifier;
   a pair of bit lines connected to said sense amplifier;
   a plurality of memory cells each comprising a series connection of a first transistor and a first capacitor connected through said first transistor to a respective one of said bit lines to store therein one of the information of "1" level and "0" level;

a pair of dummy cells each comprising a second transistor and a second capacitor connected together in series at a junction point, said second capacitor being connected through said second transistor to a respective one of said bit lines, having a capacitance substantially equal to that of each said first capacitor and generating a reference voltage which is supplied to the respective one of said bit lines and used for determining whether a respective first capacitor stores the "1" level information or the "0" level information; and a third transistor connected between the junction points of sair pair of dummy cells for short-circuiting the junction points to each other, whereby said short-circuiting causes said second capacitors to generate electric potentials which are averaged to become substantially half the sum of respective electric potentials of said second capacitors and said substantially averaged electric potential is used as said reference voltage.

* * * * *